United States Patent [19]

Izu et al.

[11] Patent Number: 4,485,264

[45] Date of Patent: Nov. 27, 1984

[54] ISOLATION LAYER FOR PHOTOVOLTAIC DEVICE AND METHOD OF PRODUCING SAME

[75] Inventors: Masatsugu Izu, Southfield; Prem Nath, Rochester, both of Mich.

[73] Assignee: Energy Conversion Devices, Inc., Troy, Mich.

[21] Appl. No.: 440,386

[22] Filed: Nov. 9, 1982

[51] Int. Cl.³ .................... H01L 31/04; H01L 31/18
[52] U.S. Cl. ................................ 136/244; 136/249; 136/258; 29/572; 357/30; 427/74
[58] Field of Search ........ 136/244, 249 MS, 258 AM; 29/572, 576 W, 583; 357/30; 427/74

[56] References Cited

U.S. PATENT DOCUMENTS 4,005,468  1/1977  Tanimura et al. .................... 357/15

Primary Examiner—Aaron Weisstuch
Attorney, Agent, or Firm—Marvin S. Siskind

[57] ABSTRACT

Large area photovoltaic devices are defined by applying a pattern of electrically-insulating material directly atop the exposed surface of the semiconductor material. Methods of producing these photovoltaic devices in a continuous or batch process are also disclosed herein. Each large area device may include a matrix of electrically-isolated segments, each segment including a common substrate, a semiconductor body atop the substrate, and a transparent, electrically-conductive coating atop the semiconductor layer. Each large area photovoltaic device may include additionally or independently thereof, an electrically-inactive region also defined by the insulating material. The instant method of producing the photovoltaic devices eliminates the scribing steps required by prior art processes, while the product includes a boundary which separates the adjacent, electrically-isolated segments.

19 Claims, 6 Drawing Figures

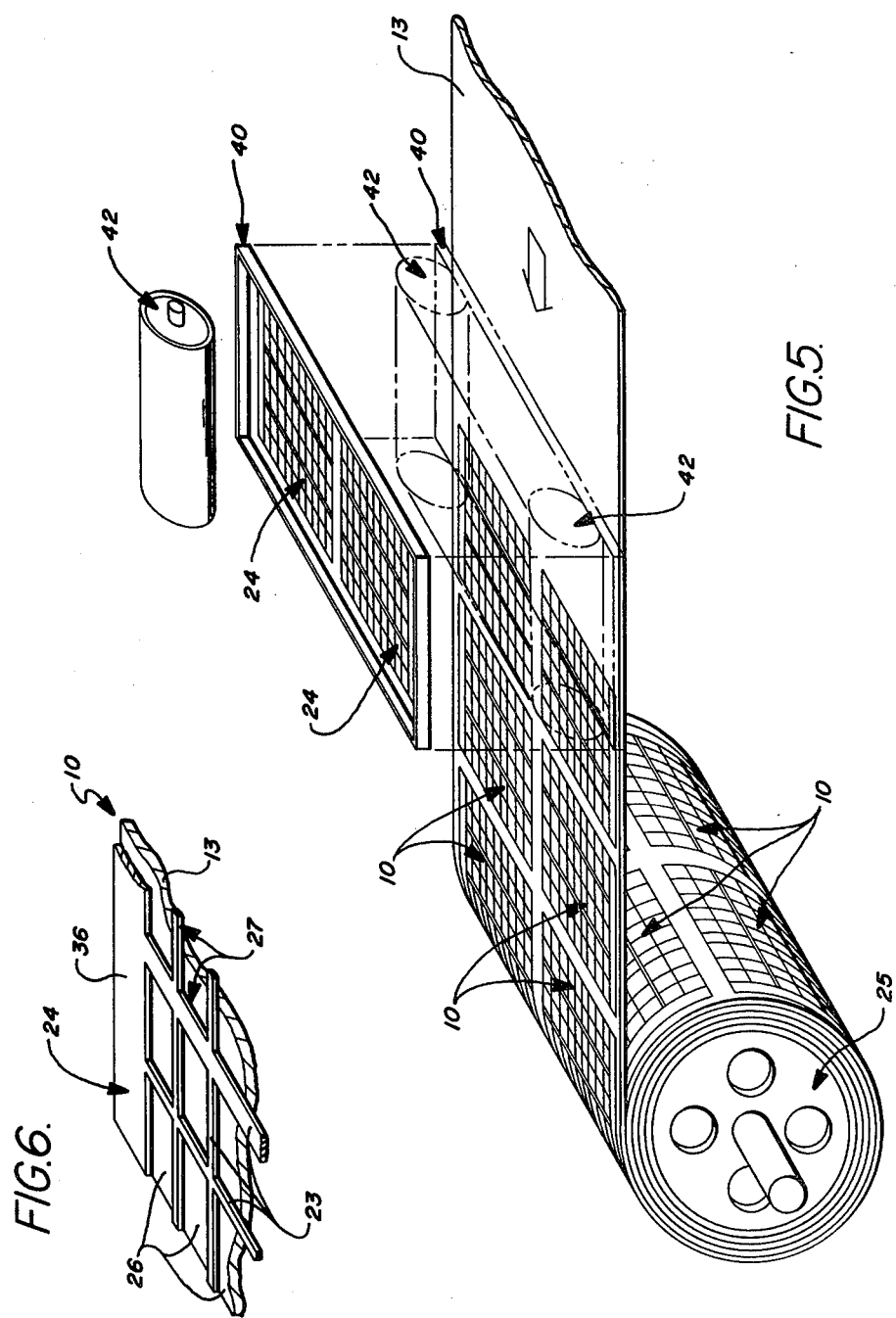

ISOLATION LAYER FOR PHOTOVOLTAIC DEVICE AND METHOD OF PRODUCING SAME

FIELD OF THE INVENTION

This invention relates generally to large area photovoltaic cells and more particurlarly to the formation of (1) spaced, electrically-isolated large area photovoltaic cells from a strip of semiconductor material; and (2) electrically-isolated small area segments of large area photovoltaic cells. Also disclosed are the methods of producing said (1) spaced, electrically-isolated large area photovoltaic cells; and (2) electrically-isolated small area segments of large area photovoltaic cells.

BACKGROUND OF THE INVENTION

Described herein are discrete, spaced, large area photovoltaic cells which are typically, but not necessarily, divided into a matrix of electrically-isolated, small area segments. The spacing and division of the large area cells is provided by an electrically-insulating material applied directly atop the semiconductor body of semiconductor material for separating adjacent large area cells and/or adjacent small area segments thereof. Also disclosed as a principal feature of the present invention is a process for fabricating, either by continuous or batch processing (1) the large area semiconductor cells from a continuous strip of photovoltaic material, and (2) the small area segments of the large area cells.

Although crystal silicon devices are the basis of the huge semiconductor industry, devices made from crystal silicon have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster and more easily in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials when p-n junction devices are to be made therefrom equivalent to those produced by their crystalline counterparts.

Greatly improved amorphous silicon alloys having significantly reduced concentrations of localized states in the energy gaps thereof and high quality electronic properties have been prepared by glow discharge deposition, as fully described in U.S. Pat. No. 4,226,898, Amorphous Semiconductors Equivalent to Crystalline Semiconductors, issued in the names of Stanford R. Ovshinsky and Arun Madan on Oct. 7, 1980, and by vapor deposition as fully described in U.S. Pat. No. 4,217,374, issued in the names of Stanford R. Ovshinsky and Masatsugu Izu, on Aug. 12, 1980, under the same title. As disclosed in these patents, which are incorporated herein by reference, fluorine is introduced into the amorphous silicon semiconductor to substantially reduce the density of localized states therein. It is believed that the activated fluorine readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity.

It is known that the efficiency of a photovoltaic device may be enhanced by stacking cells atop of each other. This concept of utilizing multiple cells, to enhance photovoltaic device efficiency, was discussed at least as early as 1955 by E. D. Jackson in U.S. Pat. No. 2,949,498, issued Aug. 16, 1960. The multiple cell structures therein discussed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage of each cell may be added, thereby producing a device which makes full use of the energy produced by incoming light.

It is of obvious commercial importance to be able to mass produce photovoltaic devices. Unlike crystalline silicon, which is limited to batch processing for the manufacture of solar cells, amorphous silicon alloys can be deposited in multiple layers over relatively large area substrates to form solar cells in a high volume, continuous processing system. Continuous processing systems of this kind are disclosed, for example, in pending patent applications: Ser. No. 151,301, filed May 19, 1980, for A Method of Making P-Doped Silicon Films and Devices Made Therefrom, now U.S. Pat. No. 4,400,409; Ser. No. 244,386, filed Mar. 16, 1981, for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method and Apparatus for Continuously Producing Tandem Photovoltaic Cells. As disclosed in these applications, a substrate may be continuously advanced through successive triads of deposition chambers, wherein each chamber is dedicated to the deposition of a specific material. In making a solar cell of p-i-n type configuration, the first chamber of each triad is dedicated for depositing a p-type amorphous semiconductor material, the second chamber of each triad is dedicated for depositing an intrinsic semiconductor material, and the third chamber of each triad is dedicated for depositing an n-type amorphous semiconductor material.

The resultant roll of large area photovoltaic cells manufactured by the mass production glow discharge deposition technique described hereinabove, comprises an elongated strip of substrate upon which successive semiconductor layers are deposited. For purposes of the instant application, the strip of substrate material (regardless of length) with semiconductor layers deposited thereonto will be referred to as the "semiconductor material".

It is well known that following the deposition of these semiconductor layers, a further processing step is needed to fabricate an operable semiconductor device. In this step, the semiconductor material must be provided with an anti-reflective, transparent, high light-transmissivity, high electrical-conductivity coating (hereinafter referred to as the "transparent conductive coating"). It is preferred that this transparent conductive coating be applied to the exposed surface of the upper semiconductor layer so as to form a matrix of electrically-isolated, small area segments which can be electrically-interconnected to form a large area photovoltaic cell.

It is desirable, based on present technology, to divide the large area photovoltaic cell into the matrix of electrically-isolated segments, described hereinabove, to obtain the greatest electrical output from the large area cell. In a large area semiconductor device, there is a likelihood that defects in the semiconductor layers, such as shorts, will occur. Depending on the location and the severity of the defect, the electrical output of the entire semiconductor body may be significantly decreased. For these reasons, it is advantageous to (1) divide the large area semiconductor device into the plurality of electrically isolated, small area segments, (2) identify those segments not performing up to a preselected set of output specifications, and (3) electrically connect only those small area segments of the large area photovoltaic cell that meet those preselected specifications. Note, however, technology is progressing to the point that shorts may not be a problem in the foreseeable future. Accordingly, the present invention is not limited in use to applications in which the large area cell is divided into small area segments, but is also applicable for uses as detailed hereinafter.

In prior art large area photovoltaic cells, the transparent, conductive coating was deposited as a continuous layer, which was subsequently scribed to form the electrically-isolated small area segments. This was a multi-step process involving (1) the deposition of the transparent, conductive coating, (2) the application of a patterned resist material by techniques such as photolithography, or the like, and, subsequently, (3) an etching step in which wet chemistry, or in some cases, plasma-etch techniques were employed. These prior art scribing processes were time consuming, labor-intensive, and involved wet chemistry. In another prior art method, the transparent, conductive coating was deposited in a discontinuous pattern by the use of a mask or stencil. While this technique offers the advantages of being a dry process suitable for a continuous mode of production, implementation of this process has inherent drawbacks; namely, problems involving the alignment of the deposition mask with the photovoltaic material.

In contrast to the foregoing, the present invention, inter alia provides a large area photovoltaic cell on which a screen printed, electrically-insulating pattern defines the matrix of electrically-isolated, small area segments. Because the scribing is accomplished by a dry, screen printing process in which the small area segments are clearly defined, the present invention represents a substantial improvement over prior art (1) photovoltaic cells and (2) scribing or discontinuous transparent, conductive coating deposition techniques. In the instant invention, the electrically-insulating material may define the matrix of small area segments of the large area cell, thereby eliminating the need to scribe the transparent, conductive layer. Obviously, the elimination of the etching step eliminates a method which could (1) impair the electrical performance of the semiconductor layers underlying the transparent, conductive coating; (2) remove too much of the transparent, conductive coating, thereby reducing current collection; or (3) remove an insufficient amount of the transparent, conductive coating, thereby having adjacent small area segments remain electrically connected.

Furthermore, as detailed supra, the photovoltaic cells of the instant invention are well adapted for continuous production in a cost efficient manner. In the preferred embodiment of this invention, the large area cells are fabricated from the roll of semiconductor material. Since this roll of semiconductor material is typically 1000 feet in length, it should be apparent that it is necessary to cut the roll to form individual large area cells therefrom. In order to efficiently cut large area cells from that 1000 foot length without creating short circuits, prior art methods would first deposit a transparent, conductive coating onto the surface of the semiconductor material and then remove the coating between adjacent large area cells. In contrast thereto, the present invention enables the large area cells to be cut without creating shorts by depositing the electrically-insulating material between the adjacent large area cells. This results in an obvious increase in efficiency of operation and economy of costs.

Note that, although a photovoltaic cell having an amorphous semiconductor body including fluorine has been described hereinabove, the present invention is not limited to amorphous semiconductors fabricated from specific process gases. This application is equally adapted for use with photovoltaic cells of any composition, whether (1) amorphous, crystalline or polycrystalline; or (2) including fluorine. Moreover, U.S. patent application Ser. No. 422,155 filed Sept. 23, 1982, entitled Compositionally Varied Materials and Method for Synthesizing The Materials and assigned to the same assignee as the instant patent application, provides a basis for obtaining photovoltaic quality response from materials previously tried and discarded, or synthesized new materials.

The many objects and advantages of the present invention will become clear from the drawings, the detailed description of the invention and the claims which follow.

BRIEF SUMMARY OF THE INVENTION

There is disclosed herein a large area photovoltaic cell comprising a matrix of electrically-isolated, small area segments. Each segment includes a common substrate, a semiconductor body atop the substrate, and a transparent electrically-conductive coating atop the semiconductor body. Prior to deposition of the transparent, conductive coating, a pattern of electrically-insulating material is applied atop the semiconductor body to divide the large area cell into the matrix of small area segments. By having the thickness of the insulating material be substantially greater than the thickness of the transparent, electrically-conductive coating, the insulating material will physically separate and electrically-isolate adjacent small area segments.

The pattern of insulating material may either independently or additionally cover a peripheral border section of the large area cell, at which section the electrical interconnection of the small area segments may be accomplished.

There is also provided herein a method of forming spaced, large area photovoltaic cells from a continuous strip of semiconductor material. The semiconductor material includes a substrate upon which a semiconductor body is deposited. The method includes the step of applying, prior to the deposition of a transparent, electrically-conductive coating, an electrically-insulating material atop the semiconductor body in a preselected pattern. The pattern divides the continuous strip into the plurality of spaced, large area photovoltaic cells. The method may include the further step of applying the electrically-insulating material so as to divide each large area cell into a matrix of electrically-insulated, small area segments. Finally, the method may include the step of applying the electrically-insulating material to a peripheral border section of each large area cell for the electrical interconnection of the small area segments thereat. After the electrically-insulating material is applied to the large area cell, a coating of a transparent, electrically-conductive material, having a thickness substantially less than the thickness of the electrically-insulating material, is applied to the exposed surface area of the photovoltaic cell.

Also described and claimed herein is a continuous strip of semiconductor material which includes a plurality of spaced, electrically-isolated, large area photovoltaic cells. The semiconductor material includes a substrate, a semiconductor body atop the substrate, and a transparent, electrically-conductive coating atop the semiconductor body. Prior to deposition of the transparent, conductive coating, a pattern of electrically-insulating material is applied atop the semiconductor body for dividing the continuous strip into a plurality of spaced, large area photovoltaic cells. The thickness of the insulating material is substantially greater than the thickness of the transparent, electrically-conductive coating. The pattern of insulating material may also divide each spaced, large area cell into a matrix of electrically-isolated, small area segments and/or an electrically-isolated peripheral border section.

BRIEF DESCRIPTION OF THE DRAWINGS

FIG. 5 is an exploded perspective view illustrating the method in which the pattern of insulating material shown in FIG. 4 is applied to the continuous strip of semiconductor material.

FIG. 6 is an enlarged, fragmentary, perspective view of a section of semiconductor material having the pattern of insulating material applied thereonto.

DETAILED DESCRIPTION OF THE DRAWINGS

I. The Photovoltaic Cell

Figure 1:
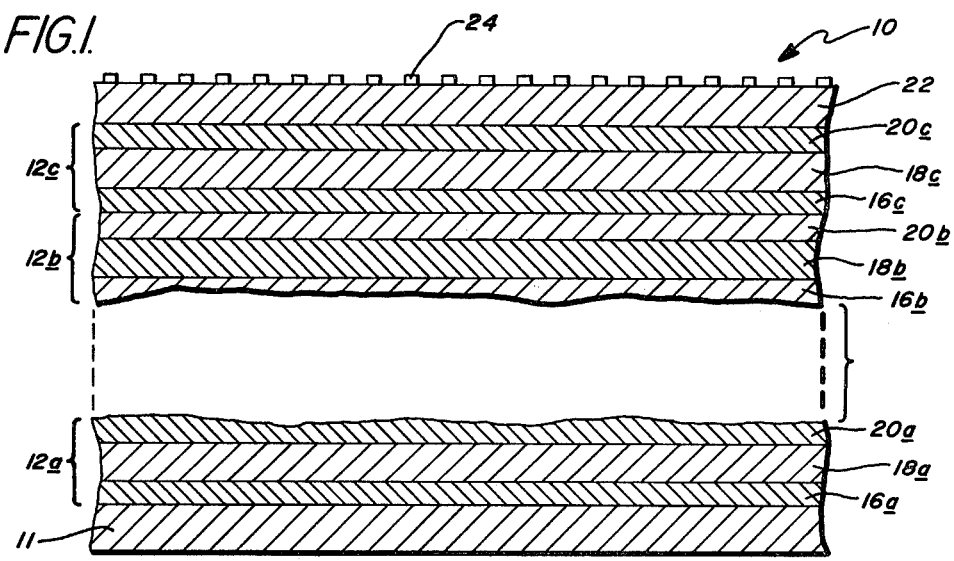
FIG. 1 is a greatly enlarged, fragmentary, cross-sectional view of a continuous length of semiconductor material comprising one or mre p-i-n type photovoltaic cells.

Referring now to the drawings and particularly to FIG. 1, a photovoltaic cell, formed of a plurality of successive p-i-n layers, each of which preferably includes an amorphous semiconductor alloy, is shown generally by the reference numeral 10. While the present invention is adapted to be used in conjunction with this type of photovoltaic cell, it is not limited solely to the production of stacked p-i-n photovoltaic cells, but is of equal value in the production of Schottky or MIS (metal-insulator-semiconductor) type cells or simply the production of thin-film semiconductor devices.

More particularly, FIG. 1 shows a stacked p-i-n type photovoltaic device such as a solar cell made up of individual p-i-n solar cells $12a$, $12b$ and $12c$. Below the lowermost cell $12a$ is a substrate 11 which may be transparent or formed from a metallic material such as stainless steel, aluminum, tantalum, molybdenum or chrome. Although certain applications may require a thin oxide layer and/or a series of base contacts prior to the application of the amorphous material, for the purpose of this application, the term substrate shall include not only a flexible film but also any elements added thereto by preliminary processing. In an alternate preferred embodiment, the substrate may be formed of glass or other such insulating material with an electrically-conductive coating applied onto one surface thereof.

Each of the cells $12a$, $12b$ and $12c$ include a semiconductor body containing, in one embodiment, at least a silicon alloy. Each of the semiconductor bodies includes an n-type conductivity region or layer $20a$, $20b$ and $20c$; an intrinsic region or layer $18a$, $18b$ and $18c$; and a p-type conductivity region or layer $16a$, $16b$ and $16c$. As illustrated, cell $12b$ is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells. Whereas, in the preferred embodiment of the present invention, an amorphous semiconductor alloy, which includes fluorine, is used to form each of the layers of the cells 12, the layers could also be formed of crystalline or polycrystalline materials, with or without the addition of fluorine. The inventive concepts disclosed herein are applicable to photovoltaic cells, regardless of materials or crystallivity.

For each of the cells $12a$, $12b$ and $12c$, the p-type layers are characterized by low light absorption and high conducivity. The intrinsic layers are characterized by an adjusted wavelength threshold for solar photoresponse, high light absorption, low dark conductivity and high photoconductivity, including sufficient amounts of a band gap adjusting element or elements to optimize the band gap for the particular cell application. Preferably, the intrinsic layers are band gap adjusted to provide cell $12a$ with a smallest band gap, cell $12c$ with the highest band gap, and cell $12b$ with a band gap between the other two. The n-type layers are characterized by low light absorption, high conductivity alloy layers. The thickness of the n-type layers is preferably in the range of about 25 to 100 angstroms. The thickness of the band gap adjusted, intrinsic alloy layers is preferably between about 2000 angstroms to 3000 angstroms.

The thickness of the p-type layers is preferably between 50 to 500 angstroms. Due to the shorter diffusion length of the holes, the p-type layers generally will be as thin as possible. Further, the outermost layer, here the p-type layer 20c, will be as thin as possible to avoid absorption of light and need not include the band gap adjusting element or elements.

It is to be understood that following the deposition of the semiconductor alloy layers a further deposition step is performed. In this step, an electrically conductive, transparent, electrically-conductive coating 22 is added atop the n-type layer 20c, which transparent, electrically-conductive coating may, for example, be a thin, 500 angstroms thick film of indium tin oxide, cadmium stannate, or doped tin oxide. This transparent, electrically-conductive coating 22, which is usually discontinuous, is deposited or scribed onto the semiconductor body, when the stacked cell is of sufficiently large surface area, or where the conductivity of a continuous layer of the transparent, electrically-conductive layer 22 is insufficient, so as to shorten the carrier path and increase the conductive efficiency of the cell. Since, in the present invention, each solar cell 10 is preferably about a one foot square, generally planar member, the use of a discontinuous transparent, electrically-conductive coating is preferred. Finally, an electrically conductive grid pattern 24, described in detail hereinafter, may be added to the top surface of the discontinuous segments of the transparent, electrically-conductive coating 22 with an electrically conductive paste.

II. Electrically Isolating Portions Of The Semiconductor Body

A. The Prior Art

Figure 2:
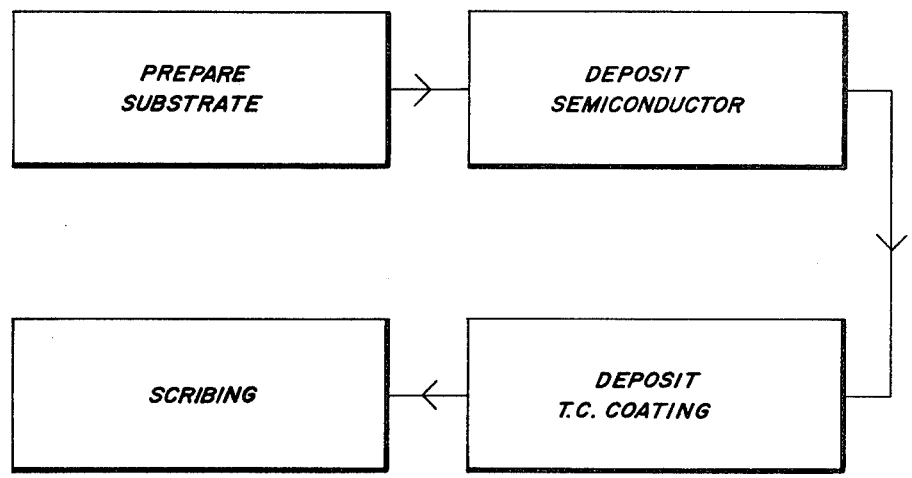
FIG. 2 is a block diagram describing the prior art method of electrically isolating small area segments of a large area photovoltaic cell.

FIG. 2 is a block diagram illustrating the manner in which portions of a large area semiconductor body were divided into electrically-isolated small area segments by prior art techniques. The first step of such prior art techniques involved the preparation of the substrate for the deposition thereonto of the semiconductor layers. The preparation typically included such steps as (1) cleaning the substrate in a hydrogen plasma, (2) texturing the substrate to provide a diffuse, reflective surface, and (3) applying a highly reflective coating to the textured substrate surface to increase reflectivity of incident light therefrom. Following preparation of the substrate, a plurality of semiconductor layers were deposited onto the textured, reflective surface thereof, through, preferably, any well known glow discharge deposition process. Now that the semiconductor layers were deposited, the transparent, electrically-conductive (referred to as T.C. in the block diagrams of FIGS. 2 and 3) coating was applied to aid in current collection over the large area cell. Finally, a scribing technique was employed to divide the large area cell into electrically isolated, small area segments by removing strips of the transparent, electrically-conductive, anti-reflective coating. Since the electrical conductivity through the transparent, electrically-conductive coating is much higher than the lateral electrical conductivity of the semiconductor layer, the electrical current preferentially flowed through the transparent, electrically-conductive coating for collection therefrom. Therefore, by dividing the transparent, electrically-conductive coating into the plurality of isolated, small area segments, the current from each segment was removed independently. In this manner, if the large area photovoltaic cell included segments of poor electrical performance, those segments were not electrically-interconnected with segments of satisfactory electrical performance.

The scribing step, was commonly accomplished in prior art methodology by a photolithographic process. Typically, a photoresist solution was applied to the surface of the transparent, electrically-conductive coating and preheated to dry off solvents, thus leaving a thin film as a residue. A photographic mask embodying the final pattern of the regions of the transparent, electrically-conductive coating was then placed upon the photoresist coated layer, and those portions of the layer not covered by the pattern were exposed to electromagnetic radiation or to a beam of electrons of appropriate energy so as to develop the photoresist layer. During the development of the layer, using conventional chemical or plasma procedures, the exposed portions (positive resist) or the unexposed portions (negative resist) of the photoresist layer and the underlying transparent, electrically-conductive material were removed. The residual photoresist film was washed away with a solvent to remove same from the surface of the transparent, electrically-conductive coating. The result was the formation of a plurality of electrically isolated, small area segments on the surface of the large area semiconductor device. The small area segments were then electrically interconnected to produce a first electrode of the large area cell, while the common substrate provided the second electrode.

Other prior art scribing techniques are disclosed in U.S. patent application Ser. No. 347,779, filed Feb. 11, 1982, and assigned to the same assignee as the present invention.

Figure 3:
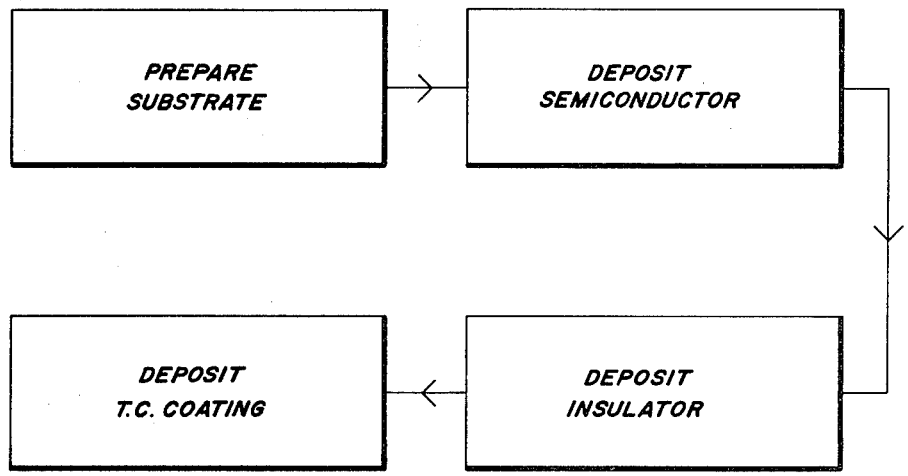
FIG. 3 is a block diagram describing the method of electrically-isolating small area segments of a large area photovoltaic cell taught by the present invention.

B. Forming The Electrically-Isolated Segments And The Peripheral Border Portion Pursuant to the inventive concept disclosed herein, FIG. 3 shows, in block diagram form, an improved method of forming electrically-isolated, smaller area segments from a large area sheet of semiconductor material. The initial steps of (1) substrate preparation, and (2) semiconductor layer deposition are substantially identical with those steps described supra with respect to the prior art. The method of the present invention differs from, and improves upon, the prior art methods by (1) eliminating the scribing step and (2) performing an insulating material application step prior to the step of depositing the transparent, electrically-conductive coating.

More particuraly, as seen in the preferred embodiment shown in FIG. 6, the large area photovoltaic cell, generally designated as 10, is divided into a matrix of electrically-siolated, small area segments 26 by applying a layer of relatively thick, electrically-insulating material 23, in a preselected pattern 24. The insulating material 23 is applied upon the top surface of the semiconductor layers prior to the deposition of the transparent, electrically-conductive coating 22. The pattern formed by the electrically-insulating material 23 is selected to divide the the subsequently deposited transparent, electrically-conductive coating 22 into a plurality of discrete regions, which effectively divide the large area cell 10 into the electrically isolated small area segments 26.

In a preferred embodiment, the pattern 24 of electrically-insulating material 23 is applied by a screen printing process in which the electrically-insulating material, 23 preferably a silicone paste dielectric compound such as 240SB sold by Electro Science Labs, is applied directly to the exposed, upper surface of the semiconductor layers. Although the screening process is depicted in FIG. 5 as continuously, although intermittently, rolling the silicon compound onto the surface of a roll 25 of semiconductor material (said material comprising a substrate with semiconductor layers deposited thereon) 13, the process is equally adapted for use in batch processing methods in which discrete large area photovoltaic cells have the electrically-insulating material screened thereonto. The silicon dielectric compound is applied at room temperature, pursuant to conventional methodology, and is subsequently cured in an oven at 150° C. for approximately 30 minutes. This process results in the application of a one to five mils thick thick layer of insulating material onto the surface of the upper semiconductor layer. In the preferred embodiment, the application of the silicon compound defines the matrix of small area, electrically-isolated segments 26 best illustrated in FIGS. 4 and 6. Simultaneously therewith, the same pattern 24 which defines the matrix as including a plurality of rows and columns of said segments 26 separated by thin strips 27 of insulating material 23, may be modified to form additional electrically-insulated regions. For example, it is desirable, in the preferred form of the invention, to electrically-insulate a relatively narrow, peripheral border section 36 of the large area solar cell 10. This insulated border section 36 is used to terminate and electrically interconnect busbars (not shown) which, in turn, electrically interconnect the small area segments 26 of each large area cell 10. This electrical interconnecting process is detailed in U.S. patent application Ser. No. 347,779, supra.

Techniques other than screen printing may be employed to apply the pattern 24 of insulating material 23. For example, the insulating material 23 may be painted or sprayed upon the substrate, by a laser printer, so as to form the desired pattern.

Following the application of the insulating material to the upper semiconductor layer, the relatively thin, transparent, electrically conductive, transparent, electrically-conductive coating 22 is deposited in any conventional manner, such as by plasma deposition. However, in contradistinction to prior art methods in which the transparent, electrically-conductive coating 22 was uniformly deposited atop the entire exposed surface of the semiconductor body, the application of the insulating material of the instant invention, results in the subsequent deposition of the transparent, electrically-conductive layer onto the exposed surface of the semiconductor body only in the discontinuous, discrete segments defined by the screen printed pattern 24 of insulating material 23. While the thickness of the insulating material 23 is not critical, it has been selected to be in the range of approximately 1-5 mils so as to be substantially greater than the thickness of the transparent, electrically-conductive coating 22 which has been mathematically and experimentally found to provide acceptable optical performance at approximately 550 angstroms thick. Due to the relative thickness dimensions, the insulating material 23 presents an electrically-isulating barrier to the current carried by the transparent, electrically-conductive coating, and thereby divides the large area cell 10 it into the plurality of discrete, electrically-isolated, small area segments 26, which in subsequent processing steps, may be interconnected, in any well known manner, to efficiently collect current from the large area photovoltaic cell 10.

Figure 4:
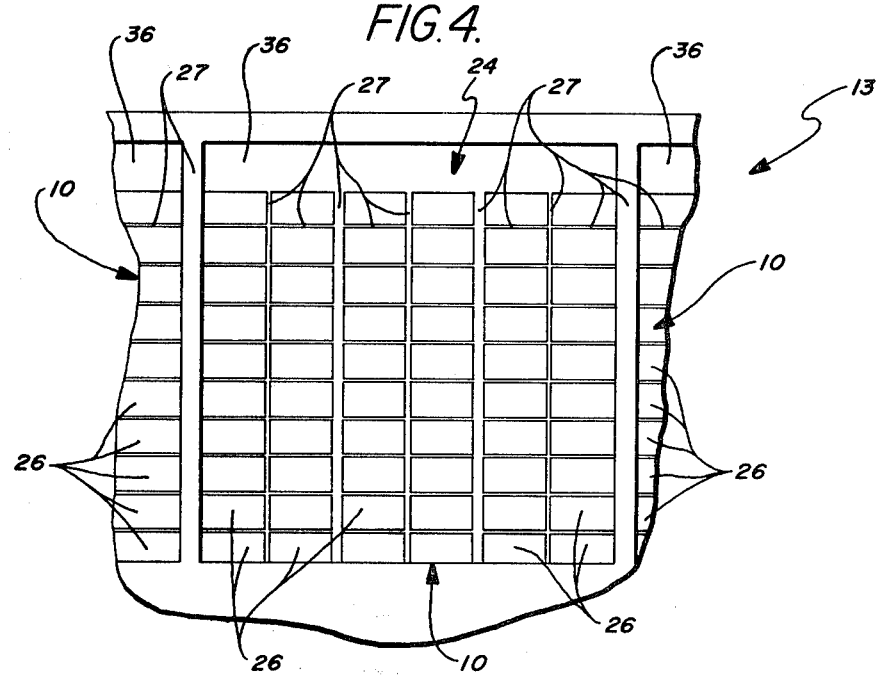
FIG. 4 is an enlarged, fragmentary, top plan view illustrating a strip of semiconductor material having deposited thereon a pattern of electrically-insulating material as per the present invention.

FIG. 4 is an enlarged, top plan view of a strip of the semiconductor material 13 from the roll 25, illustrating adjacent, large area photovoltaic cells 10 having a pattern 24 of insulating material 23 deposited thereon, according to the principles of the instant invention. The pattern 24 defines (1) the matrix of electrically-isolated segments 26, (2) the electrically-insulated, peripheral border portion 36 formed along the upper periphery of the large area cell 10, and (3) the electrically-insulated spaces 27 between said adjacent large area cells 10 as well as between the small area segments 26 thereof. Again, it must be noted that individual large area cells 10 may have the electrically-insulating material 23 applied thereonto in a batch-processing method rather than in the roll-to-roll process discussed hereinabove. Regardless of method of application, (1) the electrically insulated, peripheral border section 36 defines the "inactive" region of the large area cell 10, at which section electrical interconnection of the small area segments 26 can be made without short circuiting current to the substrate 11, and (2) any space 27 to which the insulating material 23 has been applied may be cut without short circuiting the cell. The general configuration of the small area segments 26 and the peripheral border section 36 will be substantially as depicted in FIGS. 4 and 6 (obviously, grid patterns, although not shown, may be added to each small area segment 26 to aid in current collection).

Referring specifically now to FIG. 5, the invention disclosed herein is illustrated in exploded perspective and adapted for the continuous production of large area photovoltaic cells 10 from a roll 25 of semiconductor material 13. As it is now possible to continuously produce semiconductor material in lengths of 1000 feet and widths in excess of 26 inches, it is economically desirable to fabricate large area photovoltaic cells 10 from this material 13 on a continuous basis. The continuous strip of semiconductor material 13 consists of an electrically-conductive substrate layer 11 with a semiconductor layers deposited thereupon, the semiconductor layers having been fully described with respect to FIG. 1. After depositing the semiconductor layers thereupon, the strip of photovoltaic material travels to a downstream work station, ST.1 where the insulating material 23 is applied. At the work station ST.1, a screen 40 and a roller 42 cooperate to roll the silicon insulating material 23 onto the exposed surface of the semiconductor body as the roll 25 of semiconductor material 13 intermittently, but continuously, advances along the assembly line. The screen 40 has formed thereon the pattern 24 which corresponds to the pattern illustrated in enlarged form in FIG. 4. As described above, the pattern 24 defines (1) the matrix of electrically-isolated, small area segments 26, (2) the peripheral border portion 36 approximately ⅜ inches in width and (3) the strips 27 of insulating material 23 between adjacent large area cells 10 and adjacent small area segments 26.

Following the application of the pattern 24 of electrically-insulating material 23, the strip of semiconductor material 13 may have deposited, also in roll-to-roll form, the transparent, electrically-conductive, anti-reflective coating 22, such as indium tin oxide. Following the deposition of the transparent, electrically-conductive coating 22, the strip of photovoltaic material may be sheared into individual large area photovoltaic cells 10 by cutting along the strips 27 of insulating material 23 defining the perimeter of the large area cells 10.

In another preferred embodiment of this invention, the strip of photovoltaic material of FIG. 5 may be sheared into individual large area photovoltaic cells 10 prior to the deposition of the transparent, electrically-conductive coating 22 thereupon. Subsequent processing steps remain the same.

It should be understood that the present invention is not limited to the precise structures and methods of the illustrated embodiments. It is intended that that the foregoing description of the presently preferred embodiments be regarded as illustration rather than as a limitation of the present invention. It is the following claims, including all equivalents which are intended to define the scope of this invention.

What we claim is:

1. A large area photovoltaic cell comprising a matrix of electrically-isolated, small area segments, each segment including; (a) an electrically conductive common substrate, (b) a semiconductor body atop the electrically-conductive substrate; and (c) a transparent, electrically-conductive coating atop the semiconductor body; the improvement comprising in combination:

a pattern of electrically-insulating material atop said semiconductor body, said pattern dividing said large area cell into said matrix of small area segments, the thickness of said pattern of insulating material being substantially greater than the thickness of said transparent, electrically-conductive coating, whereby said insulating material separates and electrically isolates said adjacent small area segments.

2. A cell as in claim 1, wherein the thickness of the pattern of insulating material is approximately 1 mil.

3. A cell as in claim 2, wherein the insulating material comprises a silicone paste.

4. A cell as in claim 1, wherein the pattern of insulating material divides said large area cell into 180 small area segments.

5. A cell as in claim 1, wherein the pattern of insulating material additionally covers a peripheral border section of the large area cell.

6. A cell as in claim 5, wherein the peripheral border portion is approximately $\frac{1}{8}-\frac{3}{4}$ of an inch wide.

7. A method of forming spaced, large area photovoltaic cells from a continuous strip of photovoltaic material, said photovoltaic material including: (a) an electrically-conductive substrate, and (b) a semiconductor body atop the electrically-conductive substrate; the method including the sequential steps of:

applying an electrically-insulating material atop said semiconductor body in a preselected pattern, said pattern dividing said continuous strip into a plurality of spaced, large area photovoltaic cells; and then applying said transparent, electrically-conductive coating atop said semiconductor body, the thickness of the electrically-insulating material being substantially greater than the thickness of said transparent, electrically-conductive coating.

8. A method as in claim 7, wherein each large area cell includes a matrix of electrically-isolated, small area segments, and the step of applying said electrically-insulating material atop the semiconductor body in said preselected pattern includes the application of electrically-insulating material so as to divide each large area cell into said matrix of small area segments.

9. A method as in claim 7, wherein each large area cell includes an electrically-inactive region along a peripheral border region and the step of applying said electrically-insulating material atop the semiconductor body includes the application of electrically-insulating material to said peripheral border section of each large area cell.

10. A method as in claim 7, including the additional step of cutting spaced, large area photovoltaic cells from the continuous strip of photovoltaic material.

11. A method of forming, on a large area photovoltaic cell, a matrix of electrically-conductive, small area segments which are electrically-isolated by a layer of electrically-insulating material; each segment including: (a) an electrically-conductive substrate, (b) a semiconductor body atop the electrically-conductive substrate, and (c) a transparent, electrically-conductive coating deposited atop the semiconductor body; the method including the sequential steps of:

applying said insulating material atop said semiconductor body in a preselected pattern, whereby said insulating material divides said large area cell into said matrix of electrically-isolated, small area segments; and then applying said transparent, electrically-conductive coating atop said semiconductor body, the thickness of the electrically-insulating material being substantially greater than the thickness of said transparent, electrically-conductive coating.

12. A method as in claim 11, wherein the large area photovoltaic cell further includes an electrically-inactive region along a peripheral border region and the step of applying said electrically-insulating material atop the semiconductor body includes the application of electrically-insulating material to said peripheral border portion of the large area cell.

13. A method as in claims 7 or 11, wherein said electrically-insulating material is applied in a thickness range of 1 to 5 mils.

14. A continuous strip of photovoltaic material, said strip including a plurality of spaced, electrically-isolated, large area photovoltaic cells; said photovoltaic material including (a) an electrically-conductive substrate, (b) a semiconductor body atop the electrically conductive substrate; and (c) a transparent, electrically-conductive coating atop the semiconductor body; the improvement comprising, in combination:

a pattern of electrically-insulating material atop the semiconductor body, said pattern dividing said continuous strip into said plurality of spaced, large area photovoltaic cells; the thickness of the insulating material being substantially greater than the thickness of the transparent, electrically-conductive coating.

15. A continuous strip as in claim 14, wherein the pattern of insulating material further divides each spaced, large area cell into a matrix of electrically-isolated, small area segments.

16. A continuous strip as in claim 15, wherein the pattern of insulating material additionally covers a peripheral border section of each spaced, large area cell.

17. A continuous strip as in claim 16, wherein the thickness of the pattern of insulating material is in the range of approximately 1–5 mils.

18. A continuous strip as in claim 17, wherein the insulating material comprises a silicone paste.

19. A continuous strip as in claim 18, wherein the pattern of insulating material divides each large area cell into 180 small area segments.

* * * * *